(12) United States Patent
Abs et al.

(10) Patent No.: US 11,277,934 B2
(45) Date of Patent: *Mar. 15, 2022

(54) RACK COMPRISING A HIGH POWER RF AMPLIFIER

(71) Applicant: Ion Beam Applications S.A., Louvain-la-Neuve (BE)

(72) Inventors: Michel Abs, Bossière (BE); Denis Joassin, Braives (BE)

(73) Assignee: Ion Beam Applications S.A., Louvain-la-Neuve (BE)

( * ) Notice: Subject to any disclaimer, the term of this patent is extended or adjusted under 35 U.S.C. 154(b) by 0 days.

This patent is subject to a terminal disclaimer.

(21) Appl. No.: 16/943,769

(22) Filed: Jul. 30, 2020

(65) Prior Publication Data

US 2020/0359522 A1 Nov. 12, 2020

Related U.S. Application Data

(63) Continuation of application No. 15/903,609, filed on Feb. 23, 2018, now Pat. No. 10,779,433.

(30) Foreign Application Priority Data

Mar. 27, 2017 (EP) .................................... 17163058

(51) Int. Cl.
*H03F 3/00* (2006.01)
*H05K 7/18* (2006.01)
(Continued)

(52) U.S. Cl.
CPC ............... *H05K 7/18* (2013.01); *H03F 3/211* (2013.01); *H03F 3/602* (2013.01); *H05K 7/207* (2013.01); *H03F 2203/21142* (2013.01)

(58) Field of Classification Search
None
See application file for complete search history.

(56) References Cited

U.S. PATENT DOCUMENTS 5,737,194 A * 4/1998 Hopkins .............. H05K 7/1461
361/728
6,549,405 B2 * 4/2003 Wharton ............ H05K 7/20563
165/121

(Continued)

FOREIGN PATENT DOCUMENTS

EP 2094070 A2 8/2009
EP 2980990 A1 2/2016
(Continued)

OTHER PUBLICATIONS

European Search Report for International Application No. EP 17163058 from the European Patent Office, dated Jun. 22, 2017.

*Primary Examiner* — Anthony Q Edwards
*Assistant Examiner* — Rashen E Morrison
(74) *Attorney, Agent, or Firm* — Finnegan, Henderson, Farabow, Garrett & Dunner LLP (57) ABSTRACT

In accordance with the embodiments of the present disclosure, a rack comprising a frame having first vertical posts on a first side and second vertical posts on a second side, between which a plurality of RF amplifier modules are mounted, is provided. The RF power outputs of the RF amplifier modules are connected to inputs of an RF power combiner to deliver a combined RF power output. The RF power combiner is arranged at least partially in at least one of a first volume between the first vertical posts of the frame or a second volume between the second vertical posts of the frame, thereby reducing a footprint of the rack.

17 Claims, 6 Drawing Sheets

(51) Int. Cl.
 *H05K 7/20* (2006.01)
 *H03F 3/21* (2006.01)
 *H03F 3/60* (2006.01)

(56) References Cited

U.S. PATENT DOCUMENTS

| | | | | |
|---|---|---|---|---|
| 6,842,348 B2* | 1/2005 | Lee | .................... | H05K 9/0062 |
| | | | | 361/741 |
| 7,598,461 B2* | 10/2009 | Kitamura | ............. | H05K 7/1421 |
| | | | | 174/520 |
| 7,647,044 B2* | 1/2010 | Tamminen | ............. | H03F 3/211 |
| | | | | 455/424 |
| 7,719,848 B2* | 5/2010 | Widmayer | ............. | H04B 1/036 |
| | | | | 361/752 |
| 8,189,338 B2* | 5/2012 | Turner | .................... | H05K 7/207 |
| | | | | 361/730 |
| 9,385,668 B2* | 7/2016 | Blair | ..................... | H03F 1/0277 |
| 10,779,433 B2* | 9/2020 | Abs | .......................... | H05K 7/18 |
| 2003/0001668 A1* | 1/2003 | Mruz | ..................... | H03F 3/602 |
| | | | | 330/51 |
| 2011/0149525 A1* | 6/2011 | Turner | ................... | H05K 7/207 |
| | | | | 361/730 |
| 2011/0149526 A1* | 6/2011 | Turner | ................... | H05K 7/207 |
| | | | | 361/730 |
| 2016/0112013 A1* | 4/2016 | Mao | ..................... | H03F 1/0222 |
| | | | | 330/289 |
| 2016/0112027 A1* | 4/2016 | Blair | ..................... | H01L 23/373 |
| | | | | 333/125 |

FOREIGN PATENT DOCUMENTS

| | | |
|---|---|---|
| JP | S63158905 A | 7/1988 |
| JP | 2012/100020 A | 5/2012 |
| WO | WO 2015023203 A1 | 2/2015 |

\* cited by examiner

RACK COMPRISING A HIGH POWER RF AMPLIFIER

CROSS-REFERENCE TO RELATED PATENT APPLICATIONS

This application is a continuation of U.S. Non-Provisional patent application Ser. No. 15/903,609, filed Feb. 23, 2018, which claims the benefit of a European Application No. EP17163058.5, filed Mar. 27, 2017, the disclosures of which are hereby incorporated by reference in their entireties.

FIELD OF THE PRESENT DISCLOSURE

The exemplary embodiments of the present disclosure relate to a rack comprising a high power RF amplifier, and more specifically to a rack comprising a plurality of interconnected RF amplifier modules whose outputs are combined to deliver a high power RF output.

DESCRIPTION OF PRIOR ART

Radio-Frequency (RF) power amplifiers make more and more use of solid state devices (SSD) such as power semiconductors instead of electronic vacuum tubes (triodes, tetrodes, . . . ) for amplifying RF signals to high powers. Conventional SSDs are however not capable of delivering power levels of tens or even hundreds of kilowatts, which are for example required to generate accelerating electric fields in particle accelerators. It is therefore known to combine outputs of multiple SSD amplifier modules to achieve the desired high power output. It is further known to mount SSD amplifier modules in racks and to combine their respective outputs to achieve the desired high power output.

In conventional designs, RF power combiners are arranged behind the back side of racks; therefore, the RF power combiners not only take up additional space, but are also a cumbersome obstacle to other connections to the SSD amplifier modules which are mounted in the rack, such as power supply connections and cooling fluid connections for example.

Patent publication number WO2015023203A1 discloses a power combiner which is adapted to be mounted in a 19 inch rack. Such a power combiner occupies useful space in the rack, which cannot be used for SSD amplifier modules and/or for other equipment. Furthermore, the specific design of this combiner with two times six horizontally aligned power inputs makes it necessary to use a plurality of cable connections to the power outputs of the SSD amplifier modules, so that when one wants to remove one SSD amplifier module from the rack, it is most likely that such cable connections to other SSD amplifier modules must first be dismantled, which is inconvenient.

SUMMARY OF THE PRESENT DISCLOSURE

It is an object of the present disclosure to address the problems of the state of the art high power RF amplifiers, when rack-mounted.

According to the exemplary embodiments of the present disclosure, there is provided a rack for mounting multiple equipment modules, the rack presenting a left side, a right side a front side, a back side, a top side and a bottom side. The rack may comprise a frame having left-side vertical posts and right-side vertical posts, and a plurality of RF amplifier modules, mounted to the frame between the left-side vertical posts on the one hand and the right-side vertical posts on the other hand, each amplifier module comprising an RF amplifier circuit having an RF input and an amplified RF output.

The rack may further comprise a first RF power combiner having first combiner inputs which may be connected respectively to the amplified RF outputs of the plurality of RF amplifier modules to deliver a first combined RF power output. The first RF power combiner may be mounted in the rack, at least partially in a space comprised between the left-side vertical posts of the frame or at least partially in a space comprised between the right-side vertical posts of the frame. Thanks to this arrangement, space which is conventionally not used for placing equipment in a rack, may now be used to place at least a part of the first RF power combiner. Hence, compared to conventional arrangements, the overall system may occupy less space and/or present less footprint.

Preferably, each RF amplifier module may have a front face located at the front side of the rack, and the front face may comprise an electrical circuit linking the amplified RF output of the RF amplifier module to the first RF power combiner. This may enable the use of the front face as a part of the electrical circuit or as a part of the first power combiner. In other words, the front face may have both a mechanical and an electrical function, which saves cost and space.

More preferably, each RF amplifier module may be removably mounted in the rack, and its front face may comprise a first connector to removably connect the electrical circuit to the first RF power combiner, the first connector being arranged at a distal left side and/or at a distal right side of the said front face. This may facilitate the removal and re-insertion of an RF amplifier module into the rack, without having to use loose cables or other components to link each RF amplifier module to the first power combiner. This also may provide for a more accurate connection between an RF amplifier module and the first RF power combiner, because an operator can better see the connection while it is being established.

More preferably, each RF amplifier module may comprise a printed circuit board with an RF amplifier circuit, its front face may be removably mounted to the printed circuit board, and the electrical circuit of its front face may be connected to the amplified RF output of the RF amplifier module via a second connector. This may provide an RF amplifier module without the presence of the electrical circuit of its front face.

In one example, the first RF power combiner may be completely contained in the space comprised between the left-side vertical posts of the frame or completely contained in the space comprised between the right-side vertical posts of the frame.

In another example, the first RF power combiner may be partially contained in the space comprised between the left-side vertical posts of the frame and/or partially contained in the space comprised between the right-side vertical posts of the frame, and the remaining part of the first RF power combiner may be at least partially arranged on the front face of each RF amplifier module.

Preferably, the first RF power combiner may be a Gysel type combiner (see "A new N-way power divider/combiner suitable for High power applications"—Ulrich H. Gysel—Stanford Research Institute—Menlo Park, Calif. 94025).

Preferably, a nominal frequency range of each RF amplifier module may be in the range of 3 MHz to 3 GHz. More preferably, the nominal frequency range of each RF amplifier module may be in the range of 10 MHz to 300 MHz.

Preferably, a nominal output power of each RF amplifier module may be in the range of 1 KW to 100 KW. More preferably, a nominal output power of each RF amplifier module may be in the range of 3 KW to 30 KW.

SHORT DESCRIPTION OF THE DRAWINGS

These and further aspects of the present disclosure will be explained in greater detail by way of examples and with reference to the accompanying drawings in which.

The drawings of the figures are neither drawn to scale nor proportioned. Generally, similar or identical components are denoted by the same reference numerals in the figures.

DETAILED DESCRIPTION OF EMBODIMENTS OF THE PRESENT DISCLOSURE

Figure 1:
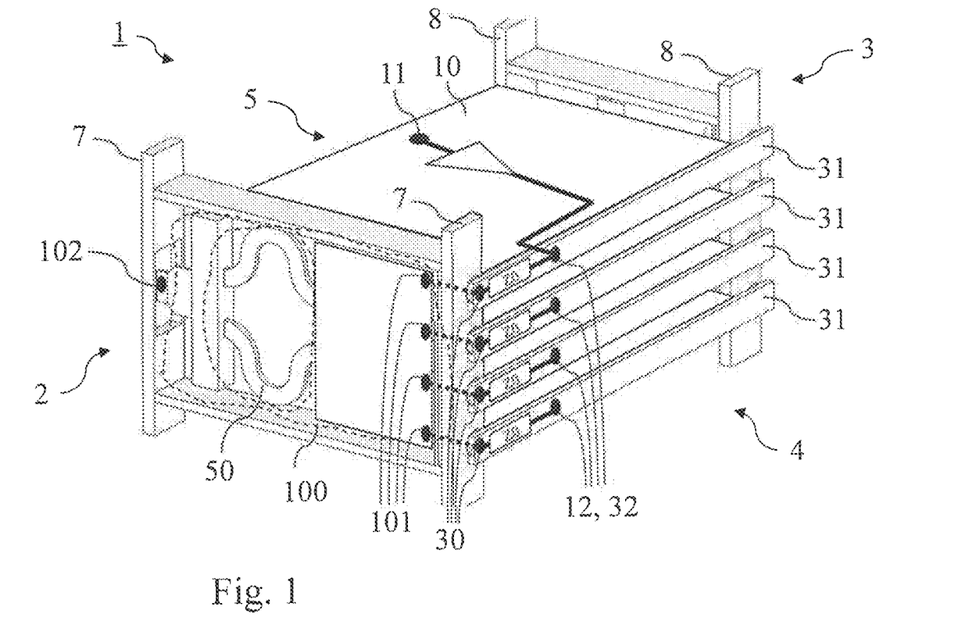
FIG. 1 shows an exemplary embodiment of a rack according to the exemplary embodiments of the present disclosure.

FIG. 1 shows an exemplary embodiment of a rack (1) according to the present disclosure.

The rack (1) may have an overall parallelepiped shape and presents a left side (2), a right side (3) a front side (4), a back side (5), a top side and a bottom side. The rack (1) may comprise a frame having two (extreme) left-side vertical posts (7) and two (extreme) right-side vertical posts (8), and a plurality of RF amplifier modules (10). Each RF amplifier module (10) may be mounted to the frame between the two left-side vertical posts (7) on the one hand and the two right-side vertical posts (8) on the other hand.

As can be seen on FIG. 1, the RF amplifier modules (10) may be each mounted horizontally in the rack (1), in a vertically stacked configuration. In other examples, the RF amplifier modules (10) may be mounted vertically in the rack (1), in a horizontally stacked configuration.

Each RF amplifier module (10) may further comprise an RF amplifier circuit having an RF input (11) and an amplified RF output (12). The RF input (11) may be for connecting a signal to be amplified and to be output to the amplified RF output (12) of the module. Preferably, each RF amplifier module (10) may be designed in such a way that, when it is rack (1) mounted, its RF input (11) is at the back side (5) of the rack (1) and its amplified RF output (12) is at the front side (4) of the rack (1).

Such an RF amplifier module (10) may for example comprise a printed circuit board defining a solid state amplifier circuit having solid-state devices for signal amplification purposes, such as RF power transistors for example.

The rack (1) may further comprise a first RF power combiner (100) having first combiner inputs (101) which are connected respectively to the amplified RF outputs (12) of the plurality of RF amplifier modules (10) to deliver a first combined RF power output (102).

In this example, the first RF power combiner (100) may be mounted in the rack (1) in a space comprised between the left-side vertical posts (7) of the frame. In another example (not shown), the first RF power combiner (100) may be mounted in the rack (1) in a space comprised between the right-side vertical posts (8) of the frame.

In this example, the rack (1) may comprise four RF amplifier modules (10) whose four amplified RF outputs (12) are connected to respectively four first combiner inputs (101) of the first RF power combiner (100), the latter being mounted in the rack (1) in a space comprised between the left-side vertical posts (7) of the frame. It will be obvious for the skilled person that other combinations and/or arrangements are possible.

Figure 2:
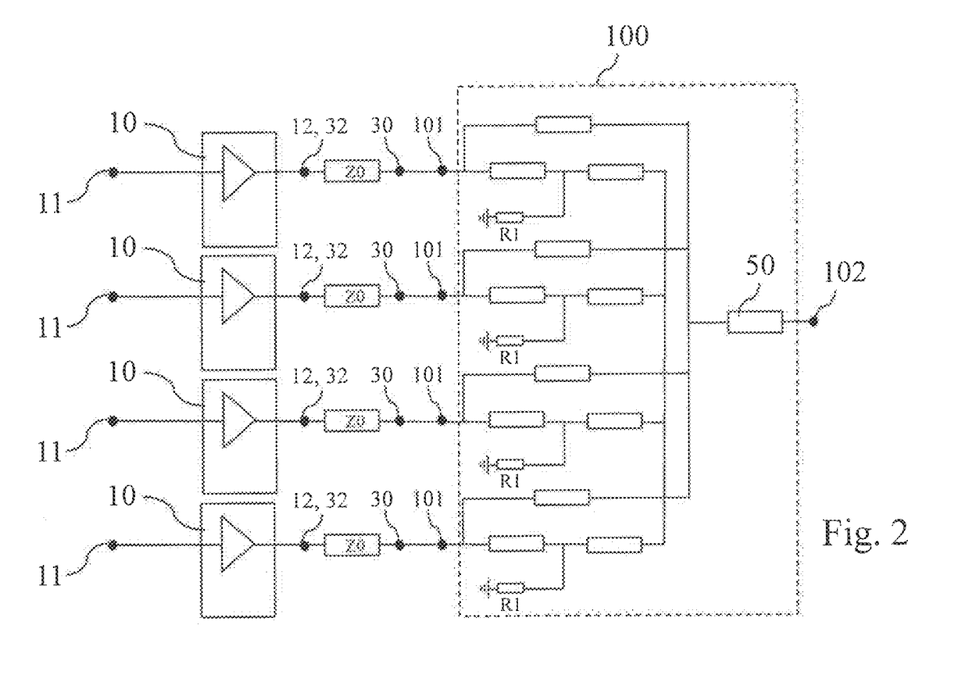
FIG. 2 shows a simplified circuit diagram for the rack of FIG. 1.

FIG. 2 shows a simplified circuit diagram for the rack (1) of FIG. 1.

Going from the left side to the right side of FIG. 2, one can see:
- the four RF amplifier modules (10) having respectively four RF inputs (11) for receiving four signals to be amplified to respectively four amplified RF outputs (12),
- the first RF power combiner (100), for example a 4-to-1 "Gysel" type combiner which is in itself known in the art of RF power combiners (e.g.: "A new N-way power divider/combiner suitable for High power applications"—Ulrich H. Gysel—Stanford Research Institute—Menlo Park, Calif. 94025),
- four transmission lines (Zo) respectively connecting the four amplified RF outputs (12) to the four first combiner inputs (101) of the first RF power combiner (100),
- the first combined RF power output (102), and
- an optional impedance adapter (50) to adapt the output impedance of the first RF power combiner (100) to 50 ohms for example.

In this example, the rack (1) may comprise four RF amplifier modules (10), and their four RF inputs (11) may for example be connected respectively to the four outputs of a 1-to-4 RF power splitter (not shown) which may or may not be mounted in or to the rack (1). The input of said RF power splitter may be fed with an RF signal to be amplified.

When it is present, the optional impedance adapter (50) may preferably be mounted in a space comprised between the left-side vertical posts (7) or in a space comprised between the right-side vertical posts (8), and at the same side (left or right) as the first RF power combiner (100), as shown in FIG. 1.

Preferably, the first combiner inputs (101) may be arranged vertically, one on top of the other, and towards the front side (4) of the rack (1). Through holes in the front left-side post may be foreseen in order to give access to the first combiner inputs (101). Preferably, the first combined RF power output (102) may then be arranged at the back side (5) of the rack (1). A through hole in the rear left-side post may be foreseen in order to give access to the first combined RF power output (102).

Preferably, each RF amplifier module (10) may have a front face (31) located at the front side (4) of the rack (1), and the front face (31) may comprise an electrical circuit linking the amplified RF output (12) of the RF amplifier module (10) to the first RF power combiner (100). In this example, the electrical circuit may be a simple transmission line having a characteristic impedance Zo.

More preferably, each RF amplifier module (10) may be removably mounted in the rack (1), and its front face may comprise a first connector (30) to removably connect the electrical circuit to the first RF power combiner (100). In this example, the first connector may be arranged at a distal left side of the said front face (31), in front of a corresponding first combiner input (101) having a mating connector.

This allows to easily insert and remove an RF amplifier module (10) from the rack (1), for example for replacement or repair. In another example (not shown) wherein the first RF power combiner (100) is mounted in the rack (1) in a space comprised between the right-side vertical posts (8) of the frame, each first connector (30) may preferably be arranged at a distal right side of the front ace of each RF amplifier module (10).

Preferably, each front face (31) may be protected by a cover made of an electrically insulating material such as plastic for example.

When each RF amplifier module (10) comprises a printed circuit board with an RF amplifier circuit and a front face (31), the front face (31) may be removably mounted to the printed circuit board, and the electrical circuit of the front face (31) may be connected to the amplified RF output (12) of the RF amplifier module (10) via a second connector (32). This may allow, for example, testing an RF amplifier module (10) without removing it from the rack (1) and without it being connected to the first power combiner.

In the example of FIG. 1 and FIG. 2, the first RF power combiner (100) may be completely contained in the space comprised between the left-side vertical posts (7) of the frame. In another example (not shown) the first RF power combiner (100) may be completely contained in the space comprised between the right-side vertical posts (8) of the frame, in which case the first connectors (30) may be arranged a distal right side of each RF amplifier module (10).

Figure 3:
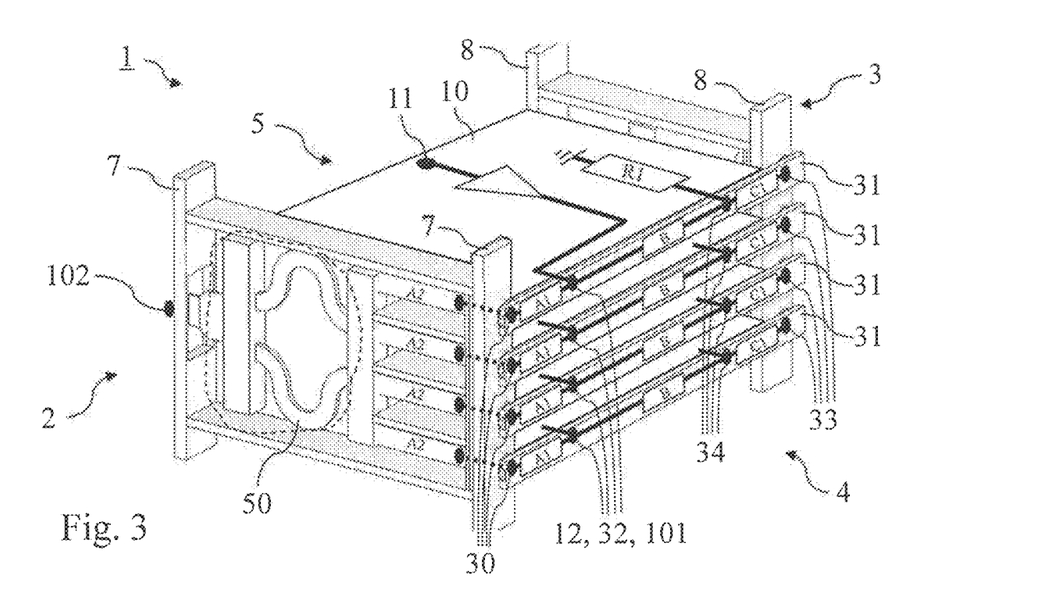
FIG. 3 shows an exemplary preferred embodiment of a rack according to the exemplary embodiments of the present disclosure.

FIG. 3 shows an exemplary preferred embodiment of a rack according to the present disclosure. It is similar to the rack (1) of FIG. 1, except that, in this case, the first RF power combiner (100) may be spatially divided in several parts:
- one part (represented by impedances A1, B and C1) may be arranged on the front face of each RF amplifier module (10),
- another part (represented by impedances A2) may be contained in the space comprised between the left-side vertical posts (7) of the frame
- yet another part (represented by impedances C2) may be contained in the space comprised between the right-side vertical posts (8) of the frame (hardly visible on FIG. 3),
- yet another part (R1) may be arranged on each RF amplifier module (10) itself.

Such an arrangement may allow optimizing the space occupied by the first power combiner.

Figure 4:
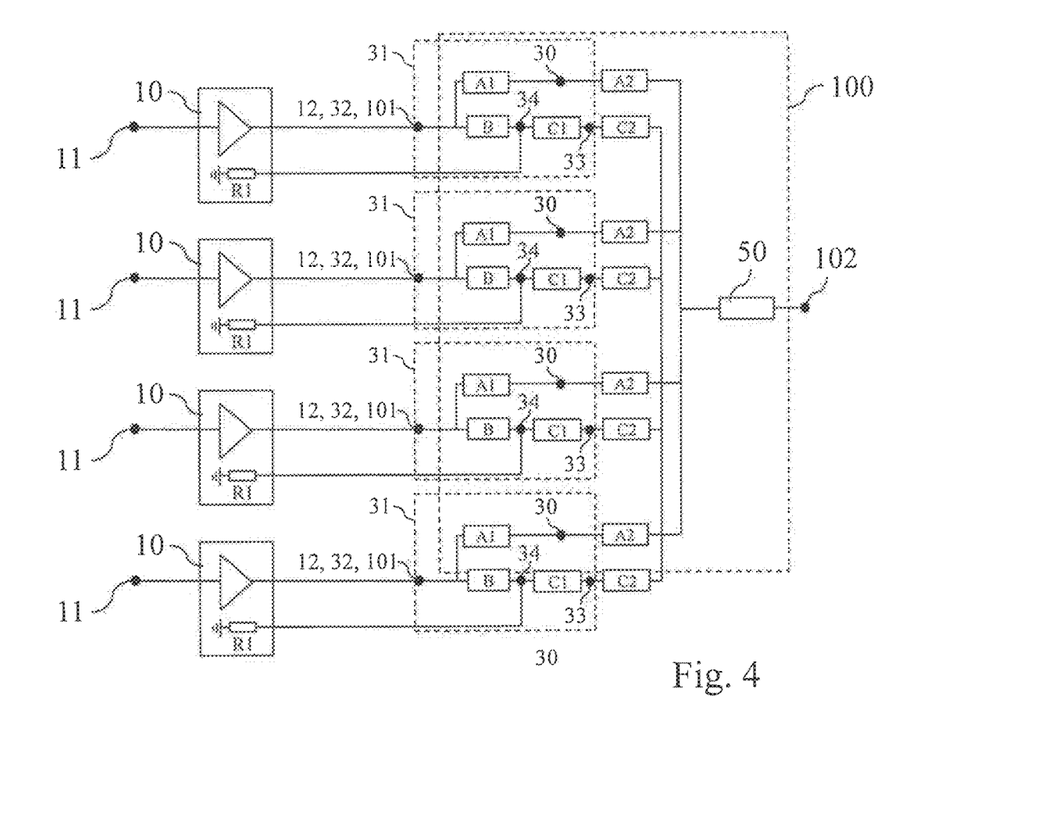
FIG. 4 shows a simplified circuit diagram of the rack of FIG. 3.

FIG. 4 shows a simplified circuit diagram of the rack of FIG. 3, whereon appear again the impedances (A1, A2, B, C1, C2, R1) cited hereinabove as well as the links between them and with the RF amplifier modules (10). The first RF power combiner (100) may be a 4-to-1 "Gysel" type combiner, as described in relation to FIG. 2.

When the first RF power combiner (100) is partially contained in the space comprised between the left-side vertical posts (7) of the frame and partially contained in the space comprised between the right-side vertical posts (8) of the frame, as is the case in the example of FIG. 3, the front face (31) of each RF amplifier module (10) may preferably comprise a third connector (33) arranged at the distal right side of the front face (31), in addition to the first connector (30) arranged at the distal left side of the front face, so as to be able to easily insert and remove each RF amplifier module (10) from the rack (1). As shown on FIG. 4, each first connector (30) makes a link between impedances A1 and A2, and each third connector (33) makes a link between impedances C1 and C2.

As shown on FIG. 3 and FIG. 4, the electrical circuit of each front face (31) of each RF amplifier module (10) may preferably comprise a connection to a load R1. Load R1 serves as a balancing load of the Gysel combiner. Preferably, each load R1 may be part of respectively each RF amplifier module (10), which allows to save space for the other parts of the Gysel combiner and/or for other components in the space comprised between the left-side vertical posts (7) of the frame or in the space comprised between the right-side vertical posts (8) of the frame. Preferably, R1 may be over-dimensioned in order to be able to test an RF amplifier module (10) on its own internal load when it is isolated from the other RF amplifier modules.

In case a front face (31) comprises the second connector (32), the front face (31) may also comprise a fourth connector (34) for connecting the load R1 to a point between impedances B and C1, as shown on FIG. 3.

Preferably, a nominal frequency range of each RF amplifier module (10) may be in the range of 3 MHz to 3 GHz. More preferably, a nominal frequency range of each RF amplifier module (10) may be in the range of 10 MHz to 300 MHz. Even more preferably, the nominal frequency of each RF amplifier module (10) may be equal to 176 MHz+/−5%.

Preferably, a nominal output power of each RF amplifier module (10) may be in the range of 1 KW to 100 KW. More preferably, a nominal output power of each RF amplifier module (10) may be in the range of 3 KW to 30 KW. Even more preferably, a nominal output power of each RF amplifier module (10) may be equal to 6 KW+/−5%.

Preferably, the first RF power combiner (100) may have a number of first combiner inputs (101) which may be between two and ten combiner inputs (101), the first combiner inputs (101) being connected to the amplified RF outputs (12) of respectively between two and ten rack-mounted RF amplifier modules (10) to deliver the first combined RF power output (102).

Figure 5:
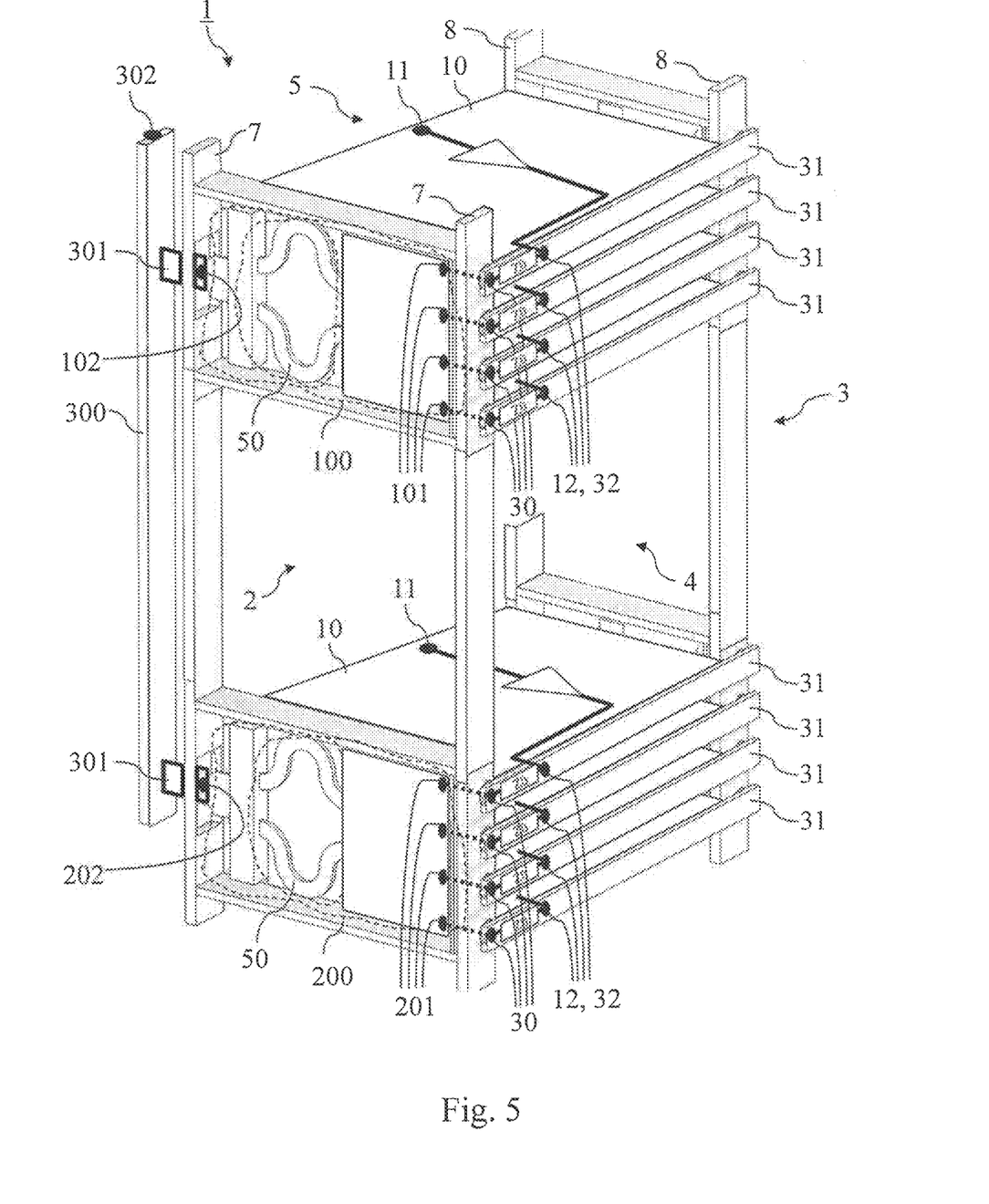
FIG. 5 shows an exemplary preferred embodiment of a rack according to the exemplary embodiments of the present disclosure.

FIG. 5 shows an exemplary preferred embodiment of a rack (1) according to the present disclosure. It is similar to the rack (1) of FIG. 1, except that the rack (1) further may comprise a second RF power combiner (200) whose second combiner inputs (201) are connected to the amplified RF outputs (12) of further RF amplifier modules (10) of the rack (1) to deliver a second combined RF power output (202). In this example, the second RF power combiner (200) may be mounted in the rack (1) in a space comprised between the left-side vertical posts (7) of the frame, or it may alternatively be mounted in a space comprised between the right-side vertical posts (8) of the frame or be divided as shown in FIG. 3 and FIG. 4 for example. The same holds for the first RF power combiner (100). The rack (1) may further comprise a third RF power combiner (300) whose third combiner inputs (301, 302) are connected to respectively the first and second combined RF power outputs (102, 202) of respectively the first and second RF power combiners (100, 200) to deliver a third combined RF power output (302). The third RF power combiner (300) may preferably be mounted at the back left side or at the back right side of the rack (1), depending on where the first and second RF power combiners have their outputs. In the example of FIG. 3, the third RF power combiner (300) may be mounted at the back left side (2) of the rack (1) because the first and second RF power combiners (100, 200) are both mounted in a space comprised between the left-side vertical posts (7) of the frame. The third RF power combiner (300) may alternatively be mounted at the back right side (3) of the rack (1) in case the first and second RF power combiners (100, 200) are mounted in a space comprised between the right-side vertical posts (8) of the frame.

Figure 6:
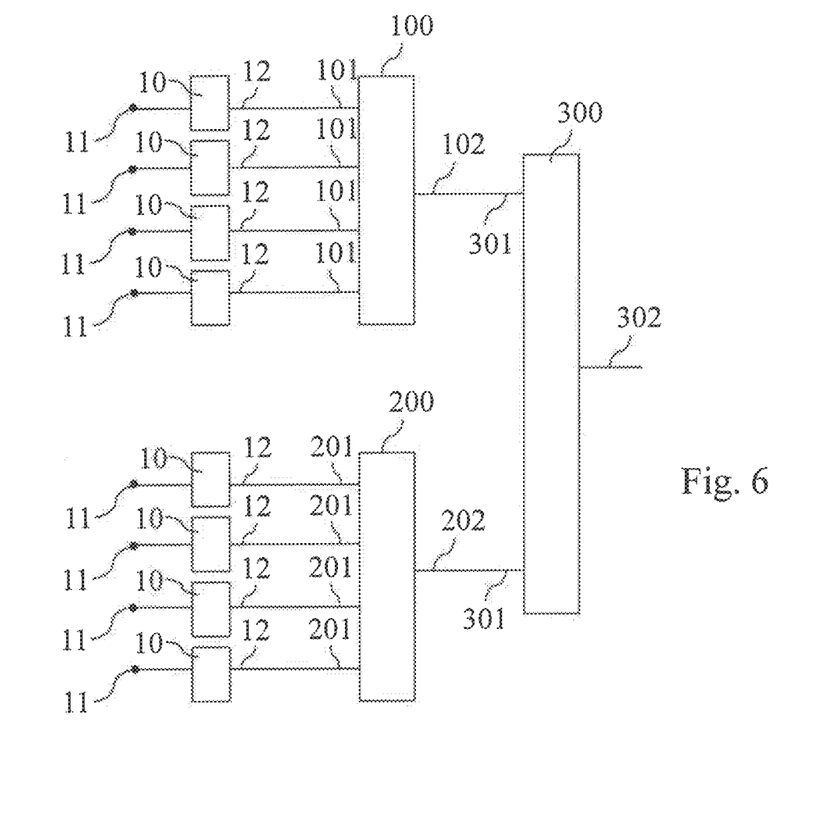
FIG. 6 shows a simplified circuit diagram for the rack of FIG. 4.

FIG. 6 shows a simplified circuit diagram for the rack (1) of FIG. 5.

Going from the left side to the right side of FIG. 6, one can see:

- eight RF amplifier modules (10) having respectively eight RF inputs (11) for receiving eight signals to be amplified to respectively eight amplified RF outputs (12). The eight signals to be amplified may for example come from a one-to-eight power splitter (not shown), which may or may not be part of the rack (1), The input of said RF power splitter may be fed with a low power RF signal to be amplified.
- the first and second RF power combiners (100, 200), each for example a 4-to-1 "Gysel" type combiner as described hereinabove,
- the first and second combined RF power outputs (102, 202) of respectively the first and second RF power combiners (100, 200),
- the third RF power combiner (300) whose third combiner inputs (301) are connected to the first and second combined RF power outputs (102, 202), and
- the third combined RF power output (302).

For the sake of clarity, transmission lines and optional impedance adapters (50) are not shown on this figure.

Figure 7:
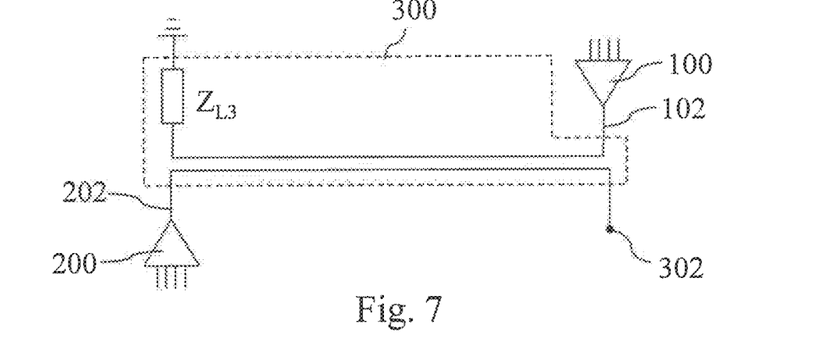
FIG. 7 shows a more detailed circuit diagram of the third RF power combiner of FIG. 6.

The third RF power combiner (300) may preferably comprise a hybrid coupled line, as shown in more detail on FIG. 7. Such a hybrid coupled line is well known in the art and will therefore not be described further.

Figure 8:
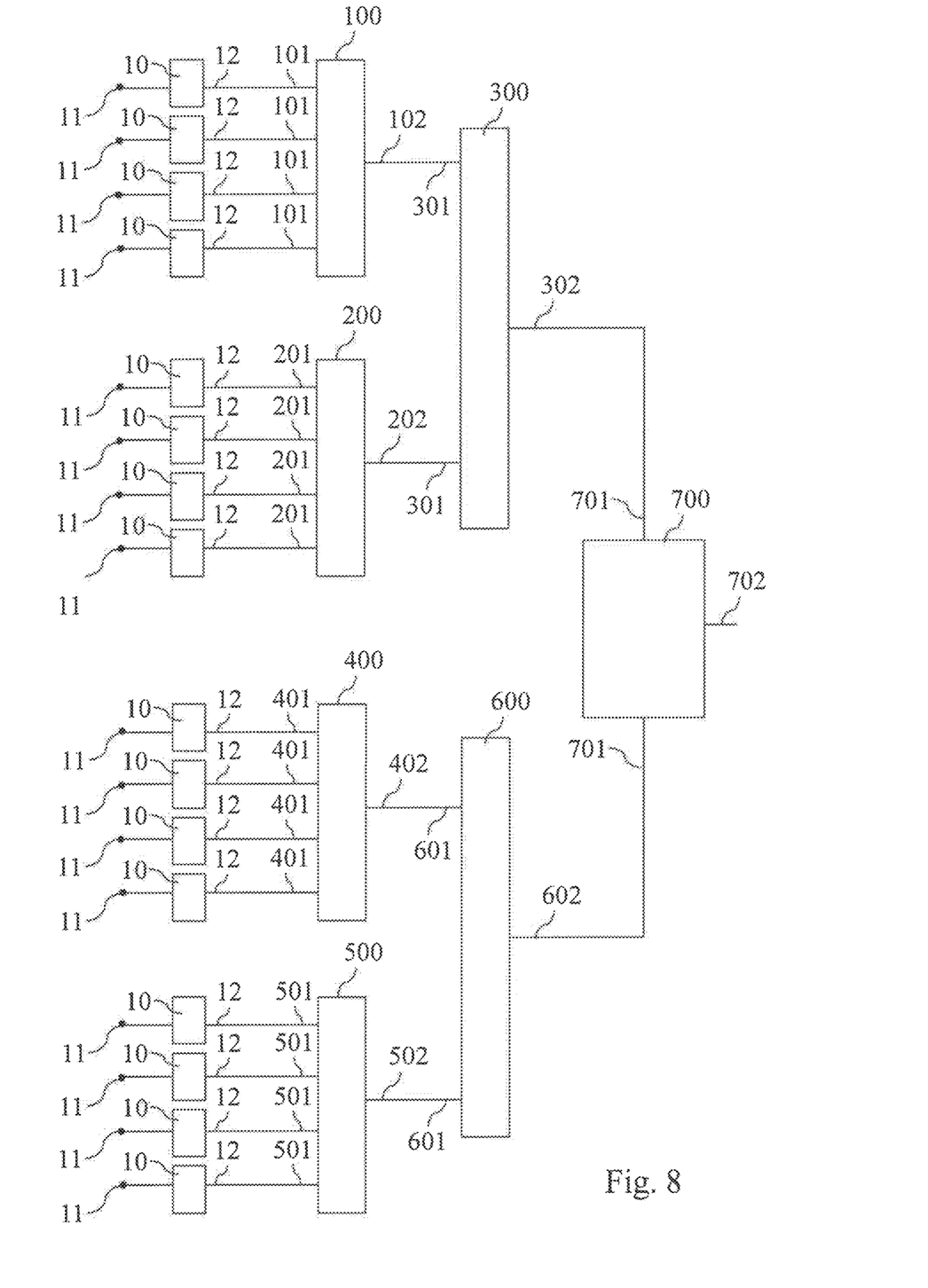
FIG. 8 shows a simplified circuit diagram of a more preferred embodiment of a rack according to the exemplary embodiments of the present disclosure.

FIG. 8 shows a simplified circuit diagram of a more preferred embodiment of a rack (1) according to the embodiments of the present disclosure. It is similar to the rack (1) of FIG. 5, except that the rack (1) may further comprise a fourth and a fifth RF power combiner (400, 500) whose fourth and fifth combiner inputs (401, 501) are respectively connected to the amplified RF outputs (12) of further RF amplifier modules (10) of the rack (1) to deliver respectively a fourth and a fifth combined RF power output (402, 502). In this example, the rack (1) may comprise sixteen RF amplifier modules (10) and their sixteen inputs may for example be connected respectively to the sixteen outputs of a 1-to-16 RF power splitter (not shown) which may or may not be mounted in the rack (1). The input of the RF power splitter may be fed with a low power RF signal to be amplified.

The fourth and fifth RF power combiners (400, 500) may be mounted in the rack (1) in a space comprised between the left-side vertical posts (7) of the frame or in a space comprised between the right-side vertical posts (8) of the frame, or are divided as shown in FIG. 3 and FIG. 4 for example. The fourth and fifth RF power combiners (400, 500) may each be for example a 4-to-1 "Gysel" type combiner as described hereinabove.

The rack (1) may further comprise a sixth RF power combiner (600) whose sixth combiner inputs (601) are connected to the fourth and fifth combined RF power outputs (402, 502) of respectively the fourth and fifth RF power combiners (400, 500) to deliver a sixth combined RF power output (602). The sixth RF power combiner (600) may also be mounted at a back side (5) of the rack (1) and may preferably be a hybrid coupled line as described hereinabove in relation to FIG. 7. Preferably, the sixth RF power combiner (600) may be mounted at a back right side (5) of the rack (1) when the third RF power combiner (300) is mounted at the back left side of the rack, and vice-versa.

The rack (1) may further comprise a seventh RF power combiner (700) whose seventh combiner inputs (701) are connected to the third and sixth combined RF power outputs (302, 602) to deliver a seventh combined RF power output (702). The seventh RF power combiner (700) may preferably be mounted on a top of the rack (1). The seventh RF power combiner (700) may preferably comprise a 90° hybrid power combiner of the branch line type, as schematically shown on FIG. 9. Such a power combiner is well known in the art and will therefore not be described further.

Figure 9:
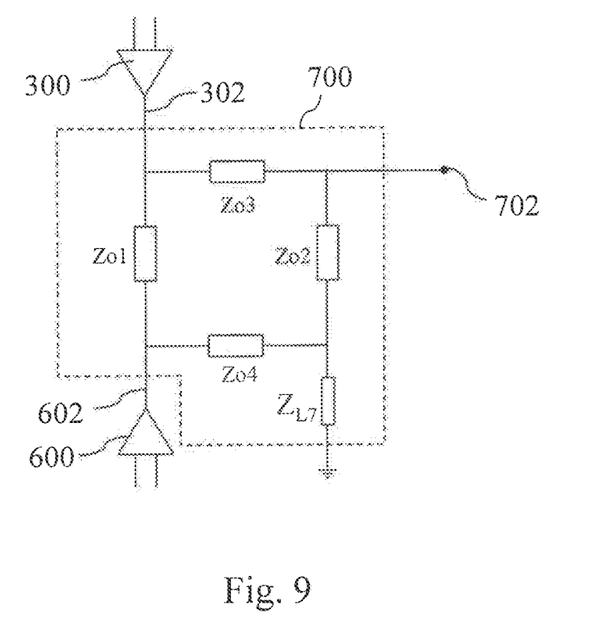
FIG. 9 shows a more detailed circuit diagram of the seventh RF power combiner of FIG. 8.

In accordance with the embodiments of the present disclosure, each RF amplifier module (10) may for example have a nominal output power 6 KW for a nominal input power of 600 mW. In that case, and with the exemplary configuration of FIG. 8, a nominal output power available at the seventh combined RF power output (702) may be 2*2*4*6 KW=96 KW. Referring to FIG. 7 and FIG. 9, the indicated impedances and rated powers may—in such a 96 KW case—for example be as follows:

$Z_{L3}$=50 ohms/25 KW
$Zo1$=50 ohms (lambda/4 line)
$Zo2$=50 ohms (lambda/4 line)
$Zo3$=35.3 ohms (lambda/4 line)
$Zo4$=35.3 ohms (lambda/4 line)
$Z_{L7}$=50 ohms 50 KW The rack (1) may have any kind of suitable dimensions. Preferably, the rack (1) according to the embodiments of the present disclosure may be a standard 19 inch rack (as for example defined in one of following standards: EIA 310-D, IEC 60297, CEA-310-E, DIN 41494), or a standard 21 inch rack (as for example defined in the following ETSI standard: ETS 300119), or 23 inch rack (Western Electric 23-inch standard).

Although not shown on the figures, other types of modules, such as power supply modules and/or control modules for example, may be mounted in the rack (1). Preferably, the RF amplifier modules (10) may be grouped by four and there may be no other types of modules between any two RF amplifier modules (10) of any group of four RF amplifier modules (10).

The exemplary embodiments of the present disclosure have been described in terms of specific embodiments, which are illustrative of the present disclosure and not to be construed as limiting. More generally, it will be appreciated by persons skilled in the art that the present disclosure is not limited by what has been particularly shown and/or described hereinabove.

Reference numerals in the claims do not limit their protective scope.

Use of the verbs "to comprise", "to include", "to be composed of", or any other variant, as well as their respective conjugations, does not exclude the presence of elements other than those stated.

Use of the article "a", "an" or "the" preceding an element does not exclude the presence of a plurality of such elements.

The exemplary embodiments of the present disclosure may also be described as follows: a rack (1) comprising a frame having left side vertical posts (2) and right side vertical posts (3) between which a plurality of RF amplifier modules (10) are mounted. The RF power outputs (12) of the RF amplifier modules (10) are connected respectively to inputs (101) of an RF power combiner (100) to deliver a combined RF power output (102). The RF power combiner (100) is arranged at least partially in a space comprised between the left-side vertical posts (7) of the frame or in a space comprised between the right-side vertical posts (8) of the frame, thereby reducing the footprint of the rack (1).

The invention claimed is:

1. A rack for mounting multiple equipment modules, the rack comprising:
   a frame having first vertical posts on a leftmost side of the frame and second vertical posts on a rightmost side of the frame;
   a plurality of RF amplifier modules mounted to the frame between the first vertical posts and the second vertical posts, each RF amplifier module further comprising an RF amplifier circuit having an RF input and an amplified RF output; and
   a first RF power combiner having first combiner inputs connected to the amplified RF outputs of at least two RF amplifier modules of the plurality of RF amplifier modules and configured to deliver a first combined RF power output, wherein:
   the first RF power combiner is at least partially contained in at least one of a first volume between the first vertical posts of the frame or a second volume between the second vertical posts of the frame;
   each of the at least two RF amplifier modules has a front face located at the front side of the rack; and
   each front face of each RF amplifier module comprises an electrical circuit coupling the respective amplified RF outputs of the at least two RF amplifier modules to the first combiner inputs of the first RF power combiner.

2. The rack of claim 1, wherein:
   the RF amplifier modules are removably mounted in the rack; and
   each front face comprises a first connector configured to removably connect the electrical circuit to the first RF power combiner, the first connector being arranged at a distal left side or at a distal right side of the front face.

3. The rack of claim 1, wherein:
   each RF amplifier module further comprises a printed circuit board with an RF amplifier circuit;
   each front face is removably mounted to the printed circuit board of the corresponding RF amplifier module; and
   the electrical circuit of each front face is connected to the amplified RF output of the corresponding RF amplifier module via a second connector.

4. The rack of claim 1, wherein a nominal operating frequency of each RF amplifier module is between 3 MHz and 3 GHz.

5. The rack of claim 1, wherein a nominal output power of each RF amplifier module is between 1 KW and 100 KW.

6. The rack of claim 5, wherein a nominal output power of each RF amplifier module is between 3 KW and 30 KW.

7. The rack of claim 1, wherein the first RF power combiner comprises between two and ten first combiner inputs, the first combiner inputs being respectively connected to between two and ten amplified RF outputs of the RF amplifier modules to deliver the first combined RF power output.

8. The rack of claim 1, further comprising an impedance adapter mounted in at least one of the first volume between the first vertical posts or the second volume between the second vertical posts.

9. A rack for mounting multiple equipment modules, comprising:
   a frame having first vertical posts on a leftmost side of the frame and second vertical posts on a rightmost side of the frame;
   a plurality of RF amplifier modules mounted to the frame between the first vertical posts and the second vertical posts, each RF amplifier module further comprising an RF amplifier circuit having an RF input and an amplified RF output;
   a first RF power combiner having first combiner inputs connected to the amplified RF outputs of at least two first RF amplifier modules of the plurality of RF amplifier modules and configured to deliver a first combined RF power output; and
   a second RF power combiner having second combiner inputs connected to the amplified RF outputs of at least two second RF amplifier modules of the plurality of RF amplifier modules and configured to deliver a second combined RF power output, wherein:
   the first and second RF power combiners are at least partially contained in at least one of a first volume between the first vertical posts of the frame or a second volume between the second vertical posts of the frame;
   each of the at least two first RF amplifier modules has a front face located at the front side of the rack; and
   each front face of each of the at least two first RF amplifier modules comprises an electrical circuit coupling the respective amplified RF outputs of the at least two first RF amplifier modules to the first combiner inputs of the first RF power combiner.

10. The rack of claim 9, wherein:
    the RF amplifier modules are removably mounted in the rack; and
    each front face comprises a first connector configured to removably connect the electrical circuit to the first RF power combiner, the first connector being arranged at a distal left side or at a distal right side of the front face.

11. The rack of claim 9, wherein:
    each RF amplifier module further comprises a printed circuit board with an RF amplifier circuit;
    each front face is removably mounted to the printed circuit board of the corresponding RF amplifier module; and
    the electrical circuit of each front face is connected to the amplified RF output of the corresponding RF amplifier module via a second connector.

12. The rack of claim 9, wherein a nominal operating frequency of each RF amplifier module is between 3 MHz and 3 GHz.

13. The rack of claim 9, wherein a nominal output power of each RF amplifier module is between 1 KW and 100 KW.

14. The rack of claim 9, wherein the first RF power combiner comprises between two and ten first combiner inputs, the first combiner inputs being respectively connected to between two and ten amplified RF outputs of the first RF amplifier modules to deliver the first combined RF power output.

15. The rack of claim 9, further comprising an impedance adapter mounted in at least one of the first volume between the first vertical posts or the second volume between the second vertical posts.

16. The rack of claim 15, wherein the impedance adapter is configured to adjust an output impedance of the first RF power combiner to 50 ohms.

17. The rack of claim 9, wherein the front face of the RF amplifier modules further comprises an electrically insulating cover.

* * * * *

UNITED STATES PATENT AND TRADEMARK OFFICE
CERTIFICATE OF CORRECTION

| | | |
|---|---|---|
| PATENT NO. | : 11,277,934 B2 | Page 1 of 1 |
| APPLICATION NO. | : 16/943769 | |
| DATED | : March 15, 2022 | |
| INVENTOR(S) | : Michel Abs et al. | |

It is certified that error appears in the above-identified patent and that said Letters Patent is hereby corrected as shown below:

On the Title Page

Item (30) Foreign Application Priority Data, "17163058" should read as --17163058.5--.

Signed and Sealed this
Twentieth Day of December, 2022

Katherine Kelly Vidal
*Director of the United States Patent and Trademark Office*